(12) United States Patent
Rosencwaig et al.

(10) Patent No.: US 6,754,305 B1
(45) Date of Patent: Jun. 22, 2004

(54) MEASUREMENT OF THIN FILMS AND BARRIER LAYERS ON PATTERNED WAFERS WITH X-RAY REFLECTOMETRY

(75) Inventors: Allan Rosencwaig, Daville, CA (US); Jon Opsal, Livermore, CA (US)

(73) Assignee: Therma-Wave, Inc., Fremont, CA (US)

( * ) Notice: Subject to any disclaimer, the term of this patent is extended or adjusted under 35 U.S.C. 154(b) by 0 days.

(21) Appl. No.: 09/629,407

(22) Filed: Aug. 1, 2000

Related U.S. Application Data

(60) Provisional application No. 60/162,679, filed on Nov. 1, 1999, and provisional application No. 60/146,832, filed on Aug. 2, 1999.

(51) Int. Cl.⁷ ............................................. G01B 15/02
(52) U.S. Cl. .............................. 378/89; 378/90; 378/82
(58) Field of Search ............................. 378/83, 70, 82, 378/63, 84, 85, 86, 87, 88, 89, 90

(56) References Cited

U.S. PATENT DOCUMENTS

| | | | | |
|---|---|---|---|---|
| 5,371,582 A | | 12/1994 | Toba et al. | 356/73 |
| 5,619,548 A | * | 4/1997 | Koppel | 378/70 |
| 5,740,226 A | | 4/1998 | Komiya et al. | 378/70 |
| 6,040,198 A | * | 3/2000 | Komiya et al. | 438/16 |

FOREIGN PATENT DOCUMENTS

| | | | |
|---|---|---|---|
| EP | 0 352 740 | 7/1989 | H01L/21/306 |
| EP | 0 760 512 | 10/1996 | G01B/11/06 |
| JP | 2720131 | 11/1997 | G01N/23/207 |
| WO | WO 01/71325 | 9/2001 | G01N/23/00 |

OTHER PUBLICATIONS

K. Sakurai et al., "Fourier Analysis of Interference Structure in X-Ray Specular Reflection from Thin Films," *Jpn. J. Appl. Phys.*, vol. 31, 1992, pp. L113–L115.

K.N. Stoev et al., "Review on grazing incidence X-ray spectrometry and reflectometry," *Spectrochimica Acta Part B*, vol. 54, 1999, pp. 41–82.

N. Wainfan et al., "Density Measurements of Some Thin Copper Films," *Journal of Applied Physics*, vol. 30, No. 10, Oct. 1959, pp. 1604–1609.

J.P. Sauro et al., "Some Observations on the Interference Fringes Formed by X Rays Scattered from Thin Films," *Physical Review*, vol. 143, No. 1, Mar. 1966, pp. 439–443.

K. Sakurai et al., Analysis of thin films by X-ray scttering at grazing incidence, *SPring-8 User Experiment Report* No. 2, (1998 A), Mar. 1999, p. 162.

(List continued on next page.)

*Primary Examiner*—David V. Bruce
*Assistant Examiner*—Hoon Song
(74) *Attorney, Agent, or Firm*—Stallman & Pollock LLP

(57) ABSTRACT

The teachings of the subject invention lead to a new application of the XRR and RXRR systems. In particular, it has been recognized for the first time that such systems can be used to measure thickness of a variety of thin films (both dielectric, opaque and metal films) on patterned wafers where the feature size is smaller than the measurement spot. Broadly speaking, one aspect of the invention is the recognition that XRR and RXRR systems can be used not only on test wafers but on patterned wafers as well. The approach of the present invention to measuring the film thicknesses of patterned semiconductor wafers using XRR relies on the recognition that the measured X-ray reflection curve can be attributed primarily to the thicknesses of the layers rather than the structure of the pattern. In one aspect of the present invention, analysis of the patterned wafer may be reduced to the problem of analyzing an unpatterned wafer through a relatively simple transformation of the data. In another aspect of the present invention, analysis of the patterned wafer may be simplified by using a Fourier transform analysis.

28 Claims, 3 Drawing Sheets

OTHER PUBLICATIONS

L.G. Parratt, "Surface Studies of Solids by Total Reflection of X–Rays," *Physical Review*, vol. 95, No. 2, Jul. 15, 1954, pp. 359–369.

M.F. Toney, "Measurements of carbon thin films using x–ray reflectivity," *J. Appl. Phys.*, vol. 66, No. 4, Aug. 15, 1989, pp. 1861–1863.

J.T. Fanton et al., "Multiparameter measurements of thin films using beam–profile reflectometry," *J. Appl. Phys.*, vol. 73, No. 11, Jun. 1, 1993, pp. 7035–7040.

J.M. Leng et al., "Simultaneous measurement of six layers in a silicon on insulator film stack using spectrophotometry and beam profile reflectometry," *J. Appl. Phys.*, vol. 81, No. 8, Apr. 15, 1997, pp. 3570–3578.

O.H. Seeck et al., "Analysis of x–ray reflectivity data from low–contrast polymer bilayer systems using a Fourier method," *Applied Physics Letters*, vol. 76, No. 19, May 8, 2000, pp. 2713–2715.

E. Chason et al., "Energy Dispersive X–Ray Reflectivity Characterization of Semiconductor Heterostructures and Interfaces," *American Institute of Physics*, 1996, pp. 512–516.

E. Luken et al., "Growth monitoring of W/Si X–ray multi-layers by X–ray reflectivity and kinetic ellipsometry," *SPIE*, vol. 2253, Nov. 1994, pp. 327–332.

* cited by examiner

5 MEASUREMENTS OVER SAME AREA ON PATTERNED
WAFER (Cu SEED/Ta BARRIER)

MEASUREMENT OF THIN FILMS AND BARRIER LAYERS ON PATTERNED WAFERS WITH X-RAY REFLECTOMETRY

PRIORITY

This Application claims the benefit of U.S. Provisional Application Nos. 60/162,679; and 60/146,832, which provisional applications were filed on Nov. 1, 1999 and Aug. 2, 1999, respectively, and are both hereby incorporated by reference in their entireties.

BACKGROUND OF THE INVENTION

The semiconductor industry has a continuing interest in measuring thin films formed on wafers. A number of metrology devices have been developed for making these measurements. Many of these devices rely on probing the sample with a beam of radiation having a wavelength in the visible and/or UV regions. These devices work quite well on many different types of films which are at least partially transparent at these wavelengths. Unfortunately, these devices are not effective for investigating opaque and metal films, since opaque and metal films (such as copper) do not transmit either UV or visible radiation.

There have recently been developed some techniques using wavelengths in the X-ray regime. These X-ray reflectometry techniques (XRR) have several advantages over techniques using visible light. One such advantage is that XRR makes it possible to measure the thickness of ultra-thin films whose thicknesses are on the order of 30 angstroms or less. Visible light is not suitable for the study of such ultra-thin films using interference patterns because of its wavelength. However, an XRR system may preferably use radiation at wavelengths of about 1.5 angstroms, which radiation creates suitable interference patterns even when probing such ultra-thin films. In addition, XRR may suitably be used where the film is composed of a material that is opaque to light, such as a metal or metal compound. Another possible application for XRR methods might be as an in-situ monitor where only a grazing angle beam of radiation can be used to monitor a sample in a process chamber. Finally, XRR may suitably be used to measure the density and thickness of films composed of materials that have a low dielectric constant and a correspondingly low index of refraction, such as certain polymers, carbon fluoride compounds, and aerogels.

A preferred XRR technique is described in U.S. Pat. No. 5,619,548, issued Apr. 8, 1997, which is hereby incorporated by reference in its entirety. FIG. 1 illustrates this preferred technique. (See also Japanese Patent No. 2,720,131, issued Nov. 21, 1997.)

Referring to FIG. 1, the preferred X-ray scattering system includes an X-ray source 31 producing an X-ray bundle 33 that comprises a plurality of X-rays shown as 35a, 35b, and 35c. An X-ray reflector 37 is placed in the path of the X-ray bundle 33. The reflector 37 directs the X-ray bundle 33 onto a test sample 39 held in a fixed position by a stage 45, and typically including a thin film layer 41 disposed on a substrate 43. Accordingly, a plurality of reflected X-rays, 57a, 57b, and 57c (forming bundle 55) concurrently illuminate the thin film layer 41 of the test sample 39 at different angles of incidence. The X-ray reflector 37 is preferably a monochromator. The diffraction of the incident bundle of X-rays 33 within the single-crystal monochromator allows only a narrow band of the incident wavelength spectrum to reach the sample 39, such that the Bragg condition is satisfied for this narrow band. As a result, the plurality of X-rays 57a, 57b, and 57c, which are directed onto the test sample 39, are also monochromatic. A detector 47 is positioned to sense X-rays reflected from the test sample 39 and to produce signals corresponding to the intensities and angles of incidence of the sensed X-rays. A processor 60 is connected to the detector to receive signals produced by the detector in order to determine various properties of the structure of the thin film layer, including thickness, density and surface roughness.

In a basic system, a probe beam of X-ray radiation is directed to strike the sample at an angle selected so that it is at least partially reflected. A sample may typically consist of a substrate covered by one or more thin metal layers. At very shallow angles, below a critical angle ($\Psi_c$) (as measured between the surface of the sample and the incoming ray), all the X-ray radiation will be reflected. As the angle of incidence of the incoming beam increases with respect to the sample surface, an increasing amount of radiation will be transmitted through the top metal layer and the amount of reflected light will be reduced. Some of the radiation transmitted through the metal layer(s) will reach the interface between the metal film and the substrate and be reflected off the substrate.

The radiation reflected at the interfaces among the metal film layer(s) and the substrate will interfere, giving rise to a reflectivity curve showing interference effects. FIG. 2 shows two such angular reflectivity spectrums. The top spectrum curve $S_2$ is for a tantalum layer on a substrate and the bottom spectrum curve $S_1$ is for copper on a substrate. This variation gives rise to the appearance of interference fringes 18 in the measured signals $S_1$ and $S_2$. Since the reflection coefficient is so small (typically much less than one), multiple reflections have a relatively undetectable effect on the X-ray reflection signal. In both curves, the reflectivity decreases rapidly with increasing $\Psi$.

In practice, the angle of incidence of the X-rays can be varied by moving the X-ray source, or by tilting the sample. In the prior art cited above, multiple angle of incidence X-rays can be created by focusing the source radiation, which functions to bend the rays within the beam to strike the sample at different angles of incidence.

The concept of the subject invention is most preferably employed with a simultaneously multiple angle of incidence embodiment, the Rapid X-ray Reflectometry or "RXRR" approach, although it can be used in the more convention al X-ray reflectometry or XRR approach, which requires actively varying the angle between the source and the sample.

The subject invention can also be applied to energy dispersive techniques in which a broad spectrum of X-ray energies are applied at a fixed angle. Such broad spectrum X-ray radiation may suitably be generated by the Bremsstrahlung radiation of a rotating anode. The X-ray reflectivity is then measured at each energy. Such an energy dispersive X-ray technique is described in Chason et al., Phys. Rev. Lett. 72, 3040 (1994) and Chason et al., Appl. Phys. Lett. 60, 2353 (1992), each of which is hereby incorporated by reference in its entirety.

Measurement of metal layers is very difficult on semiconductor patterned wafers. A typical measurement spot size for XRR or RXRR is one millimeter or larger. Since the feature sizes on a patterned wafer are on the order of one micron, and since even test sites on a patterned wafer have dimensions typically smaller than 100 microns, the accurate determination of single or two-layer metal thicknesses on a patterned wafer was believed to be very difficult.

The approach described herein provides the capability for measuring the thickness of one, two or even more layers (metal, opaque or dielectric) on patterned wafers while still using a one millimeter spot size which is larger than the feature size on the patterned wafer.

SUMMARY OF THE INVENTION

The teachings of the subject invention lead to a new application of the XRR and RXRR systems. In particular, it has been recognized for the first time that such systems can be used to measure thickness of a variety of thin films (both dielectric, opaque and metal films) on patterned wafers where the feature size is smaller than the measurement spot. Broadly speaking, one aspect of the invention is the recognition that XRR and RXRR systems can be used not only on test wafers but on patterned wafers as well. The specific teachings herein are intended to help simplify and enhance this basic concept. However, it should be understood that prior to this disclosure, we are not aware that anyone has attempted to use such systems on patterned wafers with small feature sizes.

FIG. 5 illustrates a patterned wafer 20 consisting of a silicon substrate 22, dielectric layer 24 and metal layer 26. As can be seen, the thickness of the metal layer 26 is constant, but the oxide layer 24 below varies dramatically in thickness over the diameter of the spot from X-ray beam 30. Despite this variation, which is difficult to quantify in practice, it has been found that the thickness of the metal layer 26 can still be determined accurately using XRR or RXRR techniques.

Mathematical analysis has shown that these results can be achieved since the X-ray reflection signal primarily comes from interference effects between the upper surface of the metal layer and the boundary between the metal and oxide layers. Very little signal is attributed to the thickness of the oxide layer which, as noted above, varies significantly. Part of the reason that the signal from the oxide layer is so small is that for such a relatively thick layer, any fringes would be so close together that they cannot be seen. In addition, and as noted above, since the reflection coefficient is so small, multiple reflections have a relatively undetectable effect on the X-ray reflection signal. In view of the above, mathematical modeling of the signal from patterned wafers can be simplified allowing the determination of the layer thickness.

DETAILED DESCRIPTION OF THE INVENTION

For a given sample of thin films, X-ray reflectivity can be determined using a Fresnel equation modeling as a function principally of X-ray wavelength ($\lambda$), angle of incidence, and the thicknesses and optical properties of the materials making up the layers. Typically the critical angle at which total reflection occurs is quite small (~0.1–0.5°). Because reflectivity falls very quickly as the angle of incidence is increased above the critical angle, small angle X-ray reflection is experimentally important. Under a small angle approximation (sin $\psi \cong \psi$), a recursive formula for the X-ray reflectivity at an interface between a layer n−1 and a layer n is given by $$R_{n-1,n} = a_{n-1}^4 \left( \frac{R_{n,n+1} + F_{n-1,n}}{R_{n,n+1} F_{n-1,n} + 1} \right),$$

where $$F_{n-1,n} = (f_{n-1} - f_n)/(f_{n-1} + f_n),$$

and where $a_n = \exp((-i\pi/\lambda) f_n d_n)$.

Here $d_n$ is the thickness of layer n and $\psi_c(n)$ is the critical angle at which total reflection occurs for X-rays of wavelength $\lambda$ incident on material of layer n.

The $f_n$ are given by $$f_n = A_n - i B_n,$$

where $$A_n = (1/\sqrt{2})(\{[\psi^2 - \psi_c^2(n)]^2 + 4\beta_n^2\}^{1/2} + [\psi^2 - \psi_c^2(n)])^{1/2}$$

$$B_n = (1/\sqrt{2})(\{[\psi^2 - \psi_c^2(n)]^2 + 4\beta_n^2\}^{1/2} + [\psi^2 - \psi_c^2(n)])^{1/2}$$

and where $\beta_n = \lambda \mu_n / 4\pi$, $\psi$ is the angle of incidence of the X-rays, and $\mu_n$ is the linear absorption coefficient of the layer n.

These recursive equations are solved by setting $R_{N,N+1}$ equal to 0 with layer n=N corresponding to the substrate and carrying out the resulting recursive calculations, starting at the bottom of the thin film stack. With layer n=1 corresponding to the vacuum, the product ($|R_{1,2}|^2$) of $R_{1,2}$ with its complex conjugate gives the ratio of the reflected X-ray intensity to incident X-ray intensity.

The theoretical modeling of X-ray reflection based on the classical Fresnel equations, as well as complications from the width of interfaces and microscopic surface roughness, are discussed in greater detail in the following references, each of which is hereby incorporated by reference in its entirety: L. G. Parratt, Phys. Rev. 95, 359 (1954); C. A. Lucas et al., J. Appl. Phys. 63, 1936 (1988); M. Toney, S. Brennan, J. Appl. Phys. 66, 1861 (1989).

One approach to measuring the film thicknesses of patterned semiconductor wafers using XRR relies on the recognition that the measured X-ray reflection curve can be attributed primarily to the thicknesses of the layers rather than the structure of the pattern. The wavelength of the X-rays used in the XRR measurement is on the order of a few angstroms. Compared to the feature size of the patterned wafers, which is on the order of 10,000 angstroms, the wavelength is very small. Therefore interference effects from the structure of the pattern itself are not important.

Figure 5:
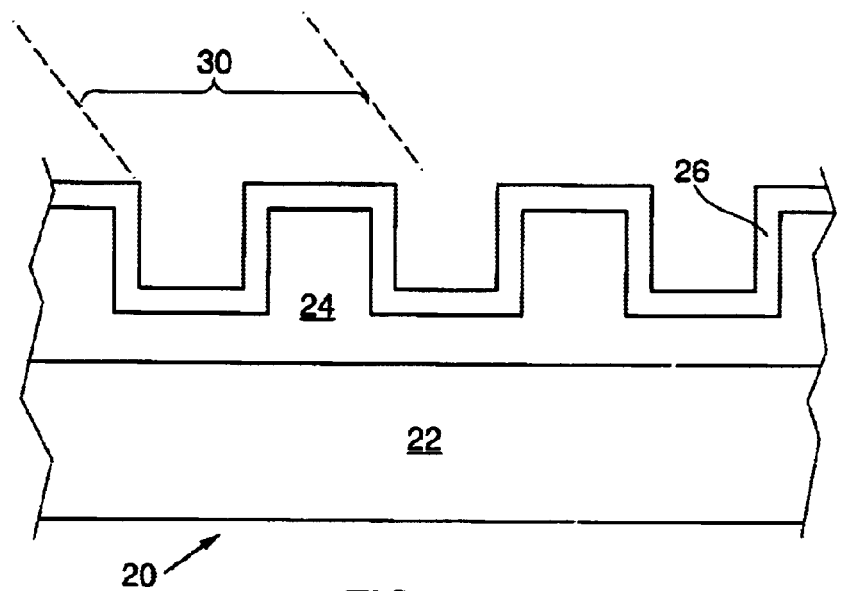
FIG. 5 shows a cross-sectional view of a line pattern of barriers on a patterned wafer sample and the incidence of X-rays onto the surface of the sample.

For example, one may consider X-rays with a plane of incidence that is perpendicular to the lines of a line pattern of a type having a perpendicular cross-section like that shown in FIG. 5. Because interference effects are relatively unimportant, the shape of the X-ray reflectivity curve is relatively unchanged by the pattern as compared to that of an unpatterned semiconductor wafer having the same layers. The most noticeable effect is that the reflected X-ray intensity may be generally reduced since, the portion of the light that is incident onto the sides and bottoms of the recesses contributes less to the reflected signal. When the depth of the recesses is large compared to the thickness of the layers being measured, one sees only minor changes in the X-ray reflectivity curve beyond the reduction in overall intensity.

As used herein, "patterned wafer" or "patterned semiconductor wafer" means a semiconductor wafer whose surface bears an artificial pattern whose features are small in size relative to the spot size of the X-ray probe beam. As noted above, typically, the measurement spot size for the probe beam is one millimeter or larger, while the features of the pattern are on the order of one micron in size, and even the test sites on a patterned wafer have dimensions typically smaller than 100 microns. Thus, there is typically at least an order of magnitude separating the X-ray probe beam spot size and the size of even the test sites on the patterned wafer.

Figure 3:
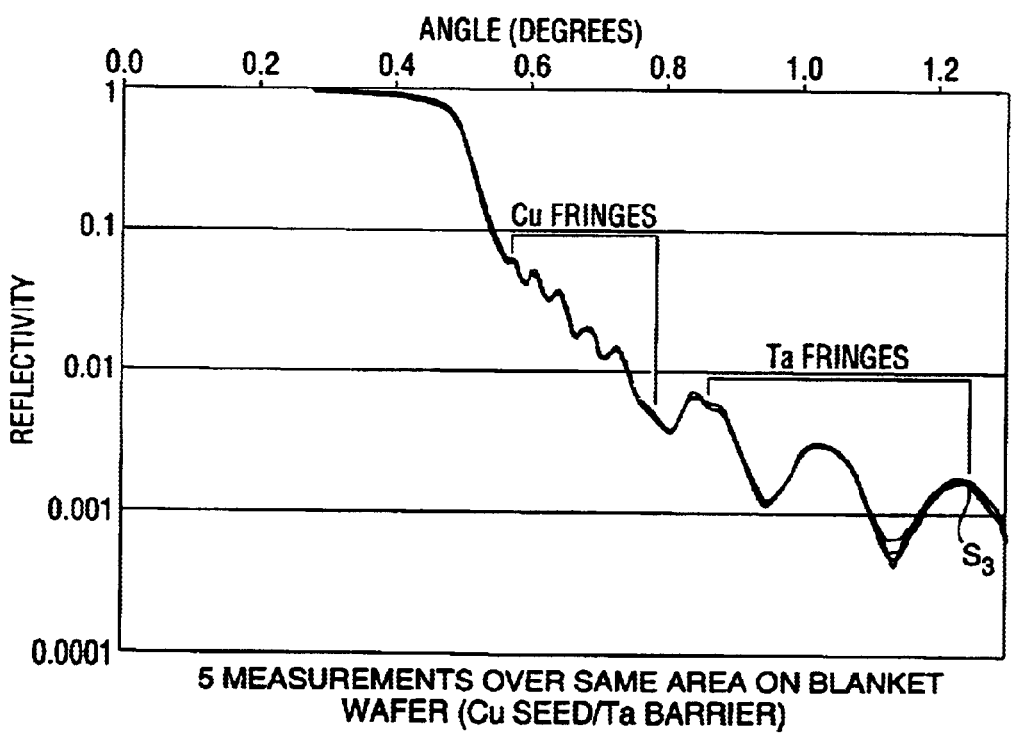
FIG. 3 shows a graph of sample X-ray reflectivity as a function of the angle of incidence to the sample for reflectivity data from an unpatterned sample with both copper and tantalum layers.

Analysis of the X-ray reflectivity curve for a patterned wafer can be greatly simplified through comparison with measurements made on an unpatterned wafer having similar layers. The unpatterned comparison wafer could be simply an unpatterned region on the patterned wafer, which unpatterned region underwent similar deposition as the patterned region. FIG. 3 shows a graph of X-ray reflectivity data from measurements made on an unpatterned wafer having an outermost layer of copper on top of a barrier layer of tantalum. The graph shows reflectivity as a function of angle of incidence on a logarithmic scale and actually shows five superimposed curves from five measurement runs made using an XRR device of the type described in U.S. Pat. No. 5,691,548.

Figure 6:
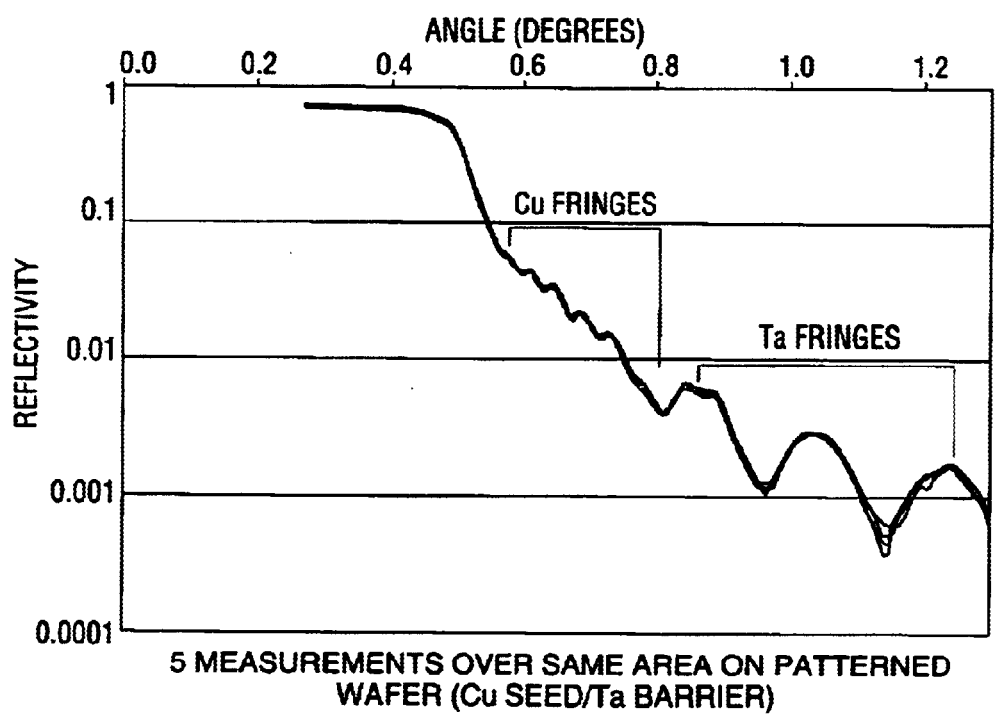
FIG. 6 shows a graph of sample X-ray reflectivity as a function of the angle of incidence to the sample for reflectivity data from a patterned wafer sample.

FIG. 6 shows a graph of X-ray reflectivity data from measurements made on a patterned wafer also having outermost layers of copper and tantalum (actually a patterned region on the same wafer measured to create FIG. 3). The graph shows reflectivity as a function of angle of incidence on a logarithmic scale and again shows five superimposed curves from five measurement runs.

The similarity in shape of FIGS. 3 and 6 is striking. According to the present invention, analysis of the patterned wafer may be reduced to the problem of analyzing an unpatterned wafer through a relatively simple transformation of the data. The results of applying such a transformation to the data are summarized in the chart below.

5 Measurements on an Unpatterned Wafer and 5 Measurements on a Patterned Wafer (Sister Wafers with PVD Cu Seed/Ta Barrier)

|  | Patterned Wafer | | Unpatterned Wafer | |
| --- | --- | --- | --- | --- |
|  | Cu Seed | Ta Barrier | Cu Seed | Ta Barrier |
| Mean | 829.4 Å | 233.2 Å | 826.0 Å | 232.8 Å |
| Range | 2 Å | 1 Å | 3 Å | 1 Å |
| 1 sigma (standard deviation) | 0.80 Å | 0.40 Å | 1.10 Å | 0.40 Å |
| 1 sigma (%) | 0.10% | 0.17% | 0.13% | 0.17% |

Fresnel equation modeling was applied to the reflectivity data to find the layer thicknesses for the unpatterned wafer, and the results are reported in the right-hand portion of the table above. The necessary parameters can be found through an iterative nonlinear least squares optimization technique such as the well-known Marquardt-Levenberg algorithm. A suitable iterative optimization technique for this purpose is described in "*Multiparameter Measurements of Thin Films Using Beam-Profile Reflectivity*," Fanton et al., Journal of Applied Physics, Vol. 73, No. 11. p. 7035 (1993) and "*Simultaneous Measurement of Six Layers in a Silicon on Insulator Film Stack Using Spectrophotometry and Beam Profile Reflectometry*," Leng et al., Journal of Applied Physics, Vol. 81, No. 8, p. 3570 (1997). These two articles are hereby incorporated by reference in their entireties.

In the case of the patterned wafer data, a simple transformation is applied based on the close resemblance of the patterned wafer reflectivity curve $RP(\theta)$ and the unpatterned wafer reflectivity curve $RU(\theta)$. (Here $\theta$ is the angle of incidence, but other dependent variables, such as the wave vector transfer, could also be used.) A transformation function $T(\theta)$ is chosen such that $RP(\theta) \times T(\theta)$ closely approximates $RU(\theta)$. The resemblance of $RP(\theta)$ and $RU(\theta)$ is such that $T(\theta)$ may appropriately be a simple linear function of $\theta$. However, more complex functions could also be chosen so that, for example, $T(\theta)$ could appropriately be a quadratic or cubic function of $\theta$ or a "splicing" of such functions for different portions of the angular spectrum.

Using a simple linear transformation function, $T(\theta)$, the data for the patterned wafer were transformed. At that point the same Fresnel equation modeling that was applied to the unpatterned wafer was applied to the transformed reflectivity data to find the layer thicknesses for the patterned wafer. The results are reported in the left-hand portion of the table above. The necessary parameters can again be found through an iterative nonlinear least squares optimization technique such as the well-known Marquardt-Levenberg algorithm.

Once the layer thickness is determined, one can then analyze the full R-$\Psi$ curve and obtain values for density and surface and interface roughness.

Another approach to finding the layer thicknesses for an unpatterned wafer is to use a Fourier transform analysis. Fourier transform analysis was applied to find layer thicknesses of polymer systems in Seeck et al., Appl. Phys. Lett. 76, 2713 (2000), hereby incorporated by reference in its entirety. An exponential Fourier transform is applied to the data, using $q_z$ the wave vector transfer as the dependent variable rather than the angel of incidence, where $q_z$ is defined as the difference between the reflected ray wave vector and the incident ray wave vector. Specifically, a transform function F(d) is used where d represents layer thickness and F(d) is given by $$F(d, q_{z,low}) = \left| \int_{q_{z,low}}^{q_{z,up}} q_z^4 I(q_z) \exp(iq_z d) \, dq_z \right|^2$$

When such a Fourier transform analysis is applied, the peaks in the transform function curve correspond to regions where the electron density of the sample is changing rapidly. In other words, the peaks in the transform function show the distances between the layer interfaces. The Fourier transform approach is quite powerful and can be applied to data from patterned wafers without making reference to data from unpatterned wafers with like layering. Fourier transform techniques are discussed in some detail in Small angle x-ray scattering, edited by O. Glatter and O. Kratky, Academic Press (1982) at pp. 126–136, which pages are hereby incorporated by reference in their entireties.

In another approach, when different fringe regimes are discernible in the data, the thicknesses of the metal films on a patterned wafer can be determined by reference to a modified Bragg equation as follows:

$$\sin^2\Psi_i = \sin^2\Psi_c + (i+\tfrac{1}{2})^2(\lambda/2d)^2$$

where "$\Psi_i$" is the angle at which there is a fringe maximum, $\Psi_c$ is the critical angle, i is a positive integer with values 1, 2, 3, . . . , $\lambda$ is the X-ray wavelength, and d is the layer thickness.

Since $\Psi_i$ and $\Psi_c$ are very small angles, and since the modified Bragg equation must be valid for all critical angles, including $\Psi_c=0$, under this approximation the angular spacing between adjacent interference fringes is a constant for a given thickness d and is given by:

ti $\Delta\Psi = \lambda/2d$

Using this approach, a thickness $d(\Delta\Psi) = \lambda/(2\Delta\Psi)$ can be associated with each fringe spacing in the curve. Since the approximative Bragg equation becomes more valid as the angle of incidence increases, an asymptotic analysis can be applied to find the true thickness d by plotting the values for $d(\Delta\Psi)$ as a function of increasing $\theta$ and extrapolating the asymptote.

A number of methods can be used to ensure that the interference fringes from the layer (or layers) of interest are discernible. These methods include:

a. Use of an appropriate X-ray wavelength to maximize interference fringes for the layer (or layers) of interest. For example, X-rays from tungsten sources have been found to work well on copper and tantalum film layers. The X-ray wavelength selected must penetrate completely through the multilayer structure under examination, so that reflections from all interfaces have an effect on the externally observed signal. Often, the X-ray tube target element is chosen so that its emission is on the low-energy (high transmission) side of an absorption edge of key multilayer constituents. Preferably, the multilayer constituents and the X-ray wavelength chosen are such that there is a high level of contrast among the contributions to the reflectivity spectrum of the various multilayer constituents.

Both copper and tungsten X-rays penetrate copper and tantalum films particularly well, and represent candidate wavelengths for measuring the copper-on-tantalum (or tantalum nitride) structures used in the semiconductor industry. Of these, tungsten, a refractory metal, is more reliable and long-lasting when used as an X-ray tube target, and was chosen for the application.

b. If necessary, use of more than one X-ray wavelength to cover the full thickness range of interest, or to more readily discern fringes from more than one layer.

c. Irradiating the wafer at an appropriate orientation of the grazing X-ray beam relative to the patterned features so as to maximize the fringe contrast. For example, in the case of a line pattern, the beam can be oriented so that the plane of incidence is parallel to the lines of the line pattern.

d. Use of appropriate X-ray wavelengths to minimize competing fringe signals from underlying layers.

Figure 2:
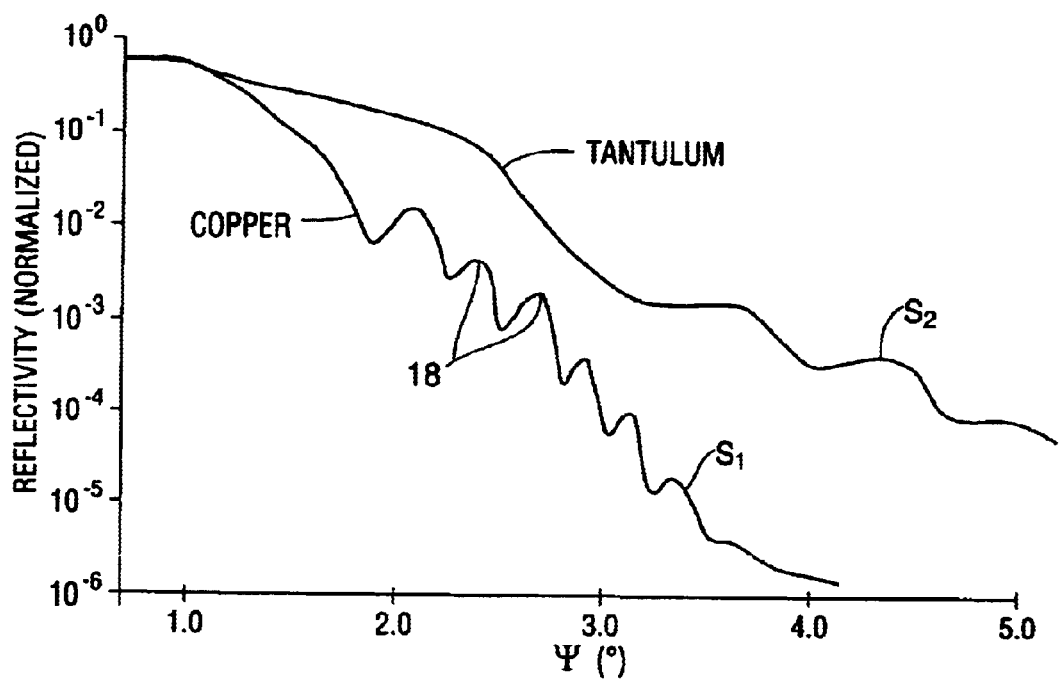
FIG. 2 shows a normalized graph of sample X-ray reflectivity as a function of the angle of incidence to the sample for reflectivity data from two different samples, one with a copper layer, and one with a tantalum layer.

In a basic example, let us assume a layer stack composed of copper on top of a thin barrier layer of tantalum. If we carefully choose an appropriate X-ray wavelength $\lambda$, we might obtain the R-$\Psi$ curves (shown in FIG. 2) for a single layer of copper ($S_1$) and a single layer of tantalum ($S_2$). Since tantalum is more dense than copper, the fringes in its curve $S_2$ are at higher $\Psi$ values. Also, since the tantalum layer is thinner than the copper layer, the interference fringes of tantalum curve $S_2$ are spaced further apart.

Figure 1:
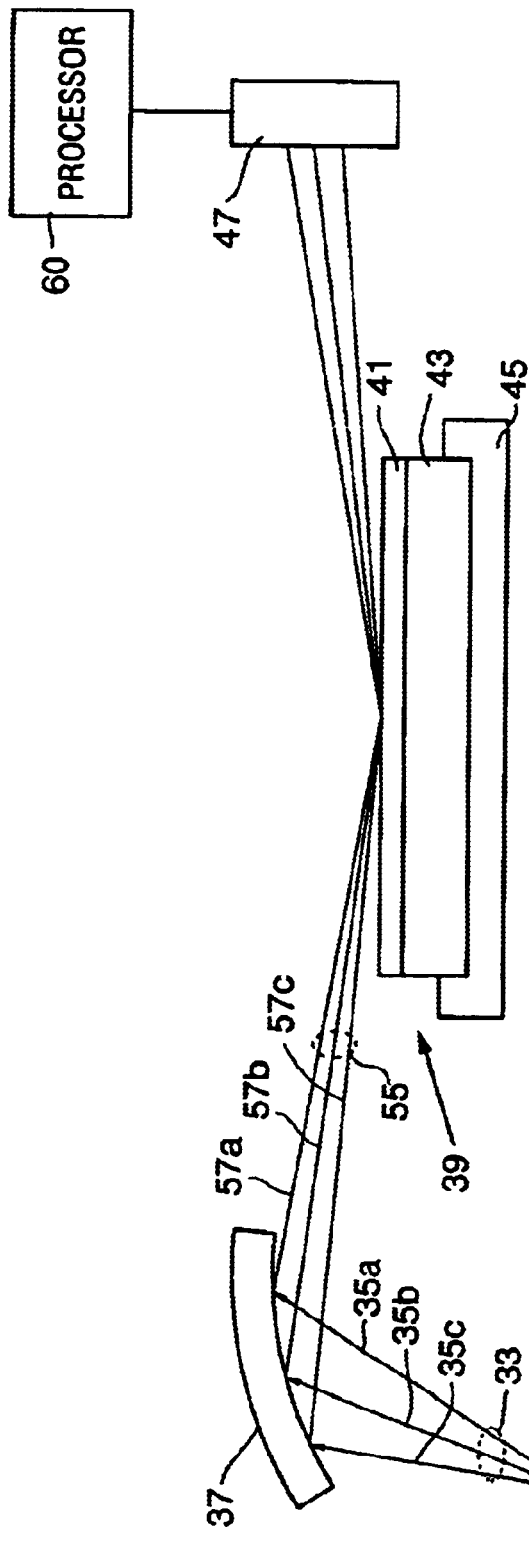
FIG. 1 shows a preferred X-ray reflectometry system.
Figure 4:
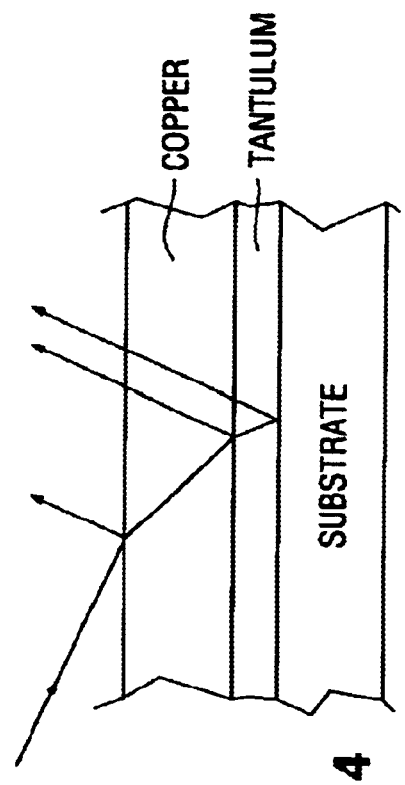
FIG. 4 shows a simplified cross-sectional view of a sample with copper and tantalum layers on a semiconductor substrate and the reflection of X-rays from three layer interfaces.

FIG. 3 represents the R-$\Psi$ curve $S_3$ one might measure when the tantalum layer is found underneath the copper layer. (FIG. 4 illustrates this layered structure.) As seen in FIG. 3, both the copper and the tantalum interference fringes are individually discernible since in the lower $\Psi$ region, there are only copper fringes, while in the higher $\Psi$ region, the tantalum fringes are considerably stronger than the copper fringes.

As noted above, the spacings between both the copper and the tantalum fringes are not strongly dependent on the underlying layers or on roughness. Thus, the thickness of both the copper and tantalum layers can be unambiguously determined from the fringe spacings even on a patterned wafer. The layer thicknesses determined using this method will be the average thickness over the one millimeter measurement area. However, this measurement average is adequate, since the thicknesses of deposited layers typically vary little over a dimension of one millimeter. It should also be noted that the slight topography present on patterned wafers will not affect the thickness measurement noticeably.

The choice of the right X-ray wavelength depends on the composition of the two layers and on the thickness ranges one needs to evaluate. Ideally, a single wavelength will permit the unambiguous measurement of the interference fringes from the two layers of interest over the required thickness ranges of both layers.

However, it may be that one cannot find a single wavelength that satisfies the above criteria. In that case, two X-ray wavelengths can be used with one wavelength providing good fringe data on one layer in the stack and the other providing good fringe data on the other layer in the stack. Using both sets of data, the thicknesses of both layers can be determined. In practice, when analyzing the spacing between fringes, one might use conventional least square fitting routines to compare the measured fringe separation to the predicted fringe separation.

In order to create two X-ray wavelengths, it may be necessary to use two X-ray sources. These two sources could be used serially by mounting the sources on a turret (for example) and bringing each source into the same position for sequential measurements on the same area of the wafer. Alternatively, one could mount the two sources at positions 90° apart and have both radiation beams focus on the same area simultaneously.

This concept can be extended to more than two X-ray sources, if needed, for example, when dealing with a metal layer stack on a layer stack containing more than two layers. Similarly, one could also use a multi-line X-ray source in place of two or more individual sources. A multi-line X-ray source might be created by using an X-ray target composed of two or more elements. One can also use continuous X-ray sources, such as synchrotrons or accelerators.

The same concepts described above can be applied with equal effectiveness to dielectric and transparent or partially absorbing films. Although such films can be measured with conventional optical methods, such as spectrometry, reflectometry and ellipsometry, there are cases where XRR or RXRR could be more effective. These cases include situations where film thickness needs to be calculated even when the optical parameters are not known, or cannot be accurately determined. This might be the case with films with graded optical parameters or spatially varying parameters.

The scope of the present invention is meant to be that set forth in the claims that follow and equivalents thereof, and is not limited to any of the specific embodiments described above.

What is claimed is:

1. A method for evaluating characteristics of thin film layers of a patterned semiconductor wafer comprising the steps of:

generating a probe beam of X-rays;

directing said probe beam onto the surface of said patterned wafer such that the spot size of said probe beam is large relative to the feature size of the pattern on said surface of said patterned wafer;

measuring the intensity of various X-rays as reflected from said patterned wafer to generate reflectivity data; and analyzing said reflectivity data to determine characteristics of said thin film layers.

2. A method as recited in claim 1 wherein said characteristics include thin film layer thicknesses.

3. A method as recited in claim 1 wherein said measuring step includes using a charge coupled device.

4. A method as recited in claim 1 wherein said measuring step includes using a self-scanning diode array.

5. A method as recited in claim 1 wherein said measuring step includes using a multiple-wire proportional counter.

6. A method as recited in claim 1 wherein said measuring step includes using a multiple-anode microchannel detector.

7. A method as recited in claim 1 wherein said directing step includes focusing and reflecting said X-rays using a curved monochrometer.

8. A method as recited in claim 1 wherein said analyzing said reflectivity data step includes applying a Fourier transform.

9. A method as recited in claim 1 wherein said analyzing said reflectivity data step includes applying a transform function to said reflectivity data, and further wherein said transform function is chosen based on a comparison of said reflectivity data with X-ray reflectivity data corresponding to measurements made on an unpatterned region of a semiconductor wafer.

10. A method as recited in claim 1 wherein said reflectivity data include data measuring reflected X-ray intensity as a function of angle of incidence.

11. A method for evaluating characteristics of thin film layers of a patterned semiconductor wafer comprising the steps of:

generating a probe beam of X-rays;

focusing said probe beam on the surface of said patterned wafer such that various X-rays within the focused probe beam create a range of angles of incidence with respect to said surface and such that the spot size of said probe beam is large relative to the feature size of the pattern on said surface of said patterned wafer;

measuring the intensity of various X-rays as a function of position within the probe beam as reflected with the positions of the X-rays within said reflected probe beam corresponding to specific angles of incidence with respect to said surface, thereby generating reflectivity data; and analyzing said reflectivity data to determine characteristics of said thin film layers.

12. A method as recited in claim 11 wherein said characteristics include thin film layer thicknesses.

13. A method as recited in claim 11 wherein said measuring step includes using a charge coupled device.

14. A method as recited in claim 11 wherein said measuring step includes using a self-scanning diode array.

15. A method as recited in claim 11 wherein said measuring step includes using a multiple-wire proportional counter.

16. A method as recited in claim 11 wherein said measuring step includes using a muitiple-anode microchannel detector.

17. A method as recited in claim 11 wherein said focusing step includes using a curved monochrometer.

18. A method as recited in claim 11 wherein said analyzing said reflectivity data step includes applying a Fourier transform.

19. A method as recited in claim 11 wherein said analyzing said reflectivity data step includes applying a transform function to said reflectivity data, and further wherein said transform function is chosen based on a comparison of said reflectivity data with X-ray reflectivity data corresponding to measurements made on an unpatterned region of a semiconductor wafer.

20. A method for evaluating characteristics of thin film layers of a patterned semiconductor wafer comprising the steps of:

generating a probe bean of X-rays having a broad spectrum of energies;

directing said probe beam onto the surface of said patterned wafer such that the spot size of said probe beam is large relative to the feature size of the pattern on said surface of said patterned wafer;

measuring the intensity of various X-rays as reflected from said patterned wafer to generate reflectivity data measuring reflected X-ray intensity as a function of X-ray energy; and analyzing said reflectivity data to determine characteristics of said thin film layers.

21. A method as recited in claim 20 wherein said characteristics include thin film layer thicknesses.

22. A method as recited in claim 20 wherein said measuring step includes using a charge coupled device.

23. A method as recited in claim 20 wherein said measuring step includes using a self-scanning diode array.

24. A method as recited in claim 20 wherein said measuring step includes using a multiple-wire proportional counter.

25. A method as recited in claim 20 wherein said measuring step includes using a multiple-anode microchannel detector.

26. A method as recited in claim 20 wherein said generating step includes using a X-ray source that emits Bremsstrahlung radiation.

27. A method as recited in claim 20 wherein said analyzing said reflectivity data step includes applying a Fourier transform.

28. A method as recited in claim 20 wherein said analyzing said reflectivity data step includes applying a transform function to said reflectivity data, and further wherein said transform function is chosen based on a comparison of said reflectivity data with X-ray reflectivity data corresponding to measurements made on an unpatterned region of a semiconductor wafer.

* * * * *